(12) United States Patent
Parupalli et al.

(10) Patent No.: US 11,277,104 B2
(45) Date of Patent: Mar. 15, 2022

(54) DYNAMIC STABILITY CONTROL IN AMPLIFIER DRIVING HIGH Q LOAD

(71) Applicant: Cirrus Logic International Semiconductor Ltd., Edinburgh (GB)

(72) Inventors: Vamsikrishna Parupalli, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 27 days.

(21) Appl. No.: 16/786,956

(22) Filed: Feb. 10, 2020

(65) Prior Publication Data
US 2021/0249998 A1 Aug. 12, 2021

(51) Int. Cl.
*H03F 1/34* (2006.01)
*H03F 3/181* (2006.01)
*H03F 1/08* (2006.01)

(52) U.S. Cl.
CPC ......... *H03F 1/34* (2013.01); *H03F 2200/129* (2013.01); *H03F 2200/144* (2013.01); *H03F 2200/153* (2013.01); *H03F 2200/156* (2013.01); *H03F 2200/462* (2013.01)

(58) Field of Classification Search
CPC .......... H03F 1/34; H03F 2200/144; H03F 2200/156; H03F 2200/129; H03F 2200/462; H03F 2200/153
USPC .............................. 330/10, 251, 207 A, 291
See application file for complete search history.

(56) References Cited

U.S. PATENT DOCUMENTS

| | | | |
|---|---|---|---|
| 1,603,305 A | 10/1926 | Zobel | |
| 8,139,792 B2* | 3/2012 | Magrath | H03F 3/45475 |
| | | | 381/120 |
| 9,577,582 B2* | 2/2017 | Botti | H03F 3/2171 |
| 2019/0379389 A1 | 12/2019 | Parupalli et al. | |

OTHER PUBLICATIONS

Zobel, Otto J. "Theory and Design of Uniform and Composite Electric Wave-filters." *Devoted to the Scientific and Engineering Aspects of Electrical Communication.* vol. II, No. 1, Jan. 1923. pp. 1-46.
Miller, John M. "Dependence of the Input Impedance of a Three-Electrode Vacuum Tube Upon the Load in the Plate Circuit." *Scientific Papers of the Bureau of Standards.* vol. 15 1919-1920 pp. 367-385.

* cited by examiner

*Primary Examiner* — Hieu P Nguyen
(74) *Attorney, Agent, or Firm* — E. Alan Davis; James W. Huffman

(57) ABSTRACT

A dynamically stabilizable amplifier drives an output current into an RLC load. A driver stage generates the output current, and a control circuit compares a current level of the amplifier output with a threshold and selectively enables a stabilizing resistor (to selectively shunt the load or dampen in series with the load, depending on RLC load type) at the driver stage output based on the comparison so that the amplifier is stable across a range of the output current level. The control circuit disables the resistor when the output current is above the highest threshold and enables it when below. The control circuit may control the resistor to have one of multiple resistance values based on a comparison with multiple thresholds. The output current level may be determined by replicating the output current level or by an input current level that sets the output current level independent of the load.

24 Claims, 11 Drawing Sheets

DYNAMIC STABILITY CONTROL IN AMPLIFIER DRIVING HIGH Q LOAD

BACKGROUND

Driving an inductive load, e.g., voice coil motor in a camera system or haptic transducer, with low direct current (DC) resistive impedance can cause a linear amplifier to go unstable if the amplifier is not compensated correctly. Typically, amplifiers driving resistive-capacitive loads will have their gain response roll down at high frequencies because of the lower impedance provided by the capacitance. The gain margin of such systems stays positive and ensures loop stability. Amplifiers driving inductive loads may have their gain response roll high as frequency increases. The gain may start rolling down at higher frequencies because of the lower impedance provided by the capacitance of the load (or by parasitic capacitance), which may cause a peaking in gain response after the phase drops by more than 180 degrees, which can make an amplifier unstable due to negative gain margin. A Zobel network is a common way to stabilize an amplifier output, originally described in the seminal paper Zobel, O. J., Theory and Design of Uniform and Composite Electric Wave Filters, Bell System Technical Journal, Vol. 2 (1923), pp. 1-46.

The stability of such systems can be improved by higher compensation capacitance within the amplifier, e.g., Miller compensation, originally described in John M. Miller, Dependence of the input impedance of a three-electrode vacuum tube upon the load in the plate circuit, Scientific Papers of the Bureau of Standards, 15(351):367-385, 1920, or by having higher quiescent current, or biasing current, within the amplifier. However, these techniques may introduce drawbacks such as reduced bandwidth and increased silicon area in the case of increased compensation capacitance or an increase in power dissipation in the case of increased quiescent current.

SUMMARY

Embodiments are described for a dynamic compensation technique to improve the stability of an amplifier driving a resistive-inductive-capacitive (RLC) load while avoiding the drawbacks described above.

In one embodiment, the present disclosure provides a dynamically stabilizable amplifier for driving an output current into a resistive, inductive, and capacitive (RLC) load. The amplifier includes a driver stage that generates the output current on an output, a stabilizing resistor at the output of the driver stage, and a control circuit that determines a level of the output current of the amplifier, compares the output current level with one or more thresholds, and selectively enables the stabilizing resistor based on the comparison so that the amplifier is stable across a range of the output current level.

In another embodiment, the present disclosure provides a method for dynamically stabilizing an amplifier driving an output current into a resistive, inductive, and capacitive (RLC) load. The method includes determining a level of the output current of the amplifier, comparing the output current level with one or more thresholds, and selectively enabling a stabilizing resistor at an output of the driver stage based on said comparing so that the amplifier is stable across a range of the output current level.

In yet another embodiment, the present disclosure provides a non-transitory computer-readable medium having instructions stored thereon that are capable of causing or configuring a dynamically stabilizable amplifier for driving an output current into a resistive, inductive, and capacitive (RLC) load. The amplifier includes a driver stage that generates the output current on an output, a stabilizing resistor at the output of the driver stage, and a control circuit that determines a level of the output current of the amplifier, compares the output current level with one or more thresholds, and selectively enables the stabilizing resistor based on the comparison so that the amplifier is stable across a range of the output current level.

DETAILED DESCRIPTION

Figure 1:
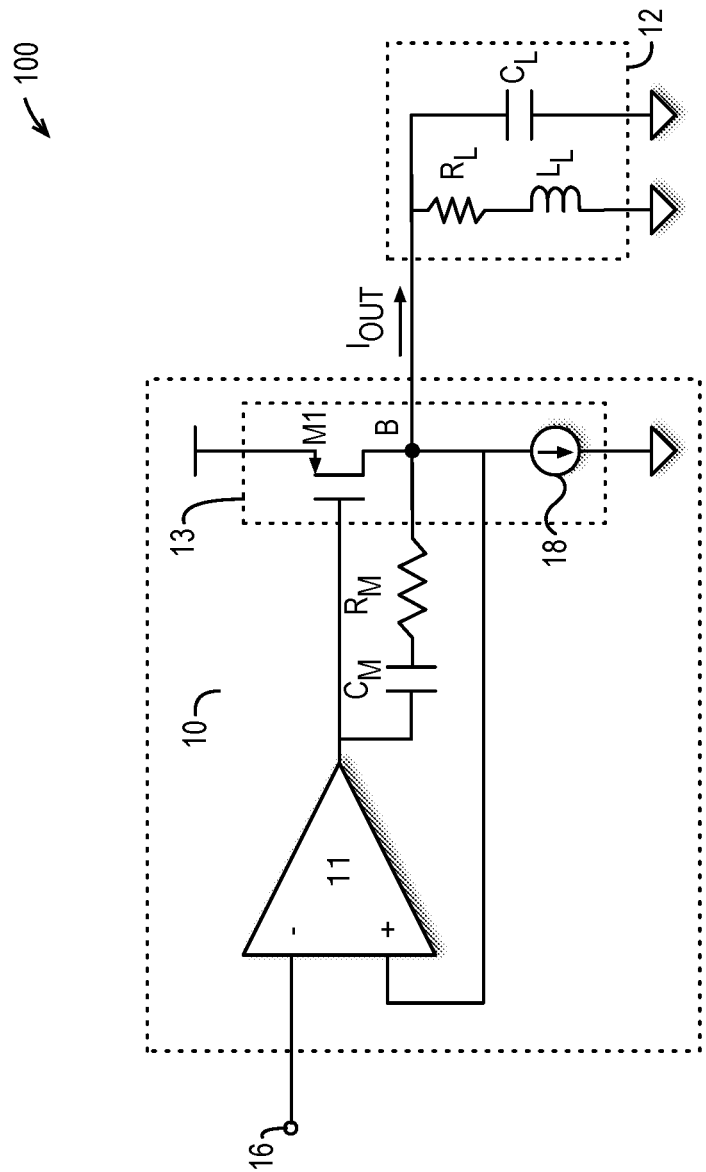
FIG. 1 is an example of a system having an amplifier driving an output current through an RLC load.

FIG. 1 is an example of a system 100 having an amplifier 10 driving an output current $I_{OUT}$ through a resistive, inductive, and capacitive (RLC) load 12. The RLC load 12 may be representative of any of various circuits or devices characterizable as a voice coil motor, such as a speaker or control motor (e.g., for stabilizing or controlling a camera) or haptic transducer, among others. The RLC load 12 is represented in FIG. 1 as a load resistor $R_L$ in series with a load inductor $L_L$, which are in parallel with a load capacitor $C_L$; however, the load 12 may be represented by other configurations of resistance, inductance and capacitance. In particular, the RLC load 12 has a high peaking impedance response, commonly referred to as a "high Q" load, or high quality-factor load.

Figure 2:
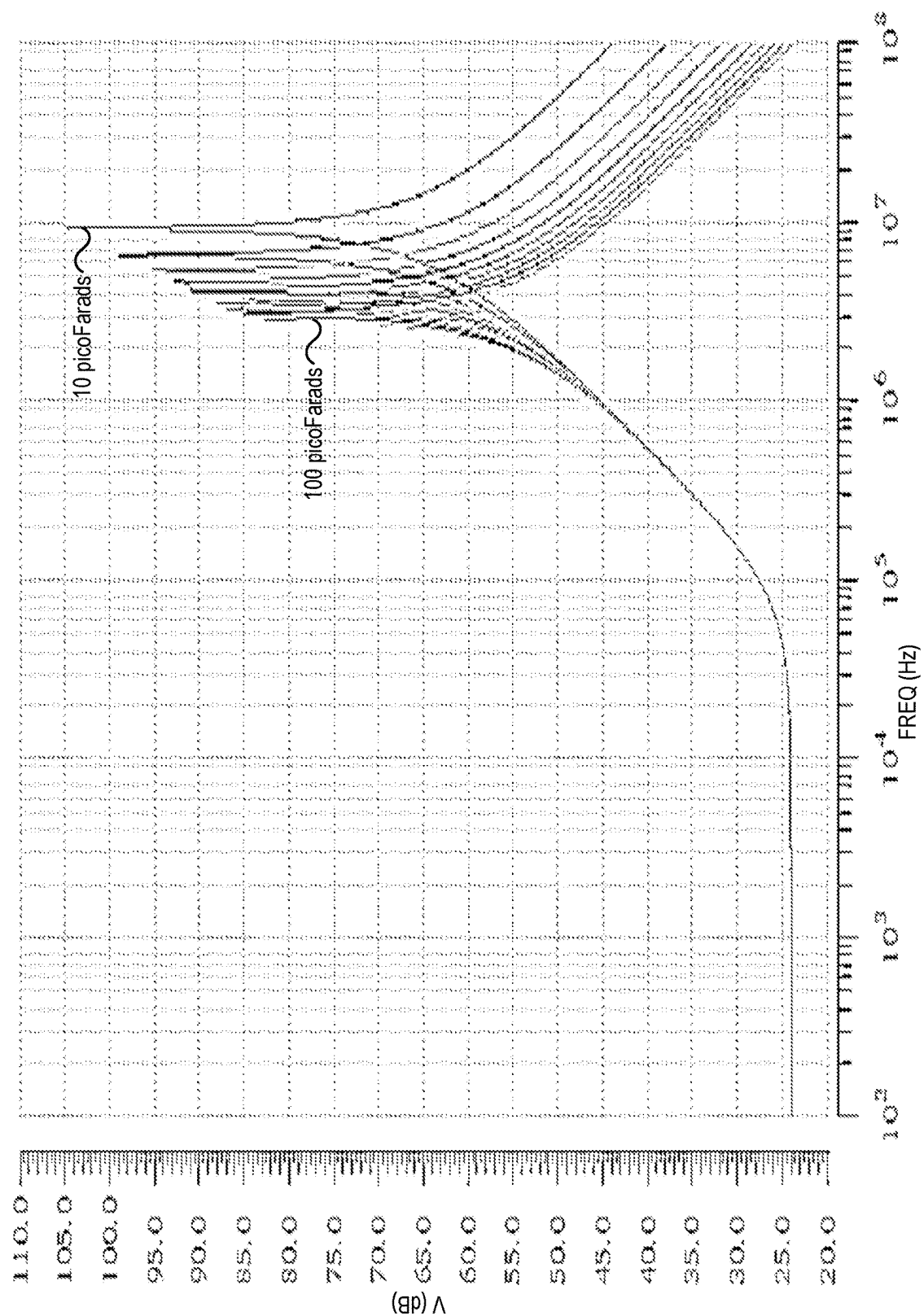
FIG. 2 is an example of a graph that illustrates a high peaking impedance response of a high Q load.

FIG. 2 is a graph that illustrates a high peaking impedance response of a high Q load. FIG. 2 shows an example of an impedance response of an RLC load, e.g., RLC load 12 of FIG. 1, of $R_L$=16 ohms and $L_L$=28.5 micro-Henries with $C_L$ swept from 10 pico-Farads to 100 pico-Farads in 10 pico-Farad increments. As may be observed, at certain frequency ranges the impedance response peaks significantly. In the example, the impedance response voltage peaks at approximately 105 dB for a 10 pico-Farad load capacitance $C_L$ value at approximately 3 MHz and approximately 80 dB for a 100 pico-Farad load capacitance $C_L$ value at approximately 9 MHz. The peak in impedance response may generally be explained as follows. At low frequency the impedance of the inductor is very low, and the impedance of the capacitor is high, causing the impedance of the RLC load 12 to be close to the impedance of the resistor. As frequency increases, the impedance of the inductor $L_L$ increases, causing the impedance of the RLC load 12 to increase. As frequency further increases, the impedance of the capacitor decreases, causing the impedance of the RLC load 12 to decrease.

FIG. 1 is now referred to again. The embodiment of the amplifier 10 is a two-stage amplifier, although other embodiments with different numbers of stages are contemplated. The amplifier 10 includes an operational amplifier stage 11 and an output driver stage 13 that receives the output of the operational amplifier 11. In the embodiment of FIG. 1, the inverting input of the operational amplifier 11 receives a signal input 16, and the non-inverting input of the operational amplifier 11 is connected to the output node B of the amplifier 10. In the embodiment of FIG. 1, the driver stage 13 includes a P-channel metal oxide semiconductor field effect transistor (MOSFET) M1 having its source connected to a source voltage, its drain connected to a ground side biasing current source 18, and its gate connected to the output of the operational amplifier 11. A Miller compensation capacitor $C_M$ and resistor $R_M$ in series connect the output of the first stage 11 to the output node of the driver stage 13, which is the output node of the amplifier 10, to which the RLC load 12 is connected.

The output impedance $Z_{OUT}$ of the system 100 viewed at the output node B of the amplifier 10 is effectively the impedance $Z_{LOAD}$ of the RLC load 12 in parallel with the output impedance $R_{AMP}$ of the amplifier 10. The output impedance $R_{AMP}$ of the amplifier 10 is effectively the output drain-to-source impedance $R_{ds}$ of the driver stage MOSFET M1. The supply to which the source of the driver stage MOSFET M1 is connected is the equivalent of a small signal ground; thus, the load 12 is in parallel with the output impedance $R_{ds}$ of the driver stage MOSFET M1 from a small signal perspective. The gain of the amplifier 10 is the product of the gain of the first stage 11 and the gain of the driver stage 13. The gain of the first stage 11 is constant across changes in the RLC load 12. The gain of the driver stage 13 is the product of the system output impedance $Z_{OUT}$ and the transconductance $g_m$ of the driver stage MOSFET M1. Thus, the gain of the driver stage 13 varies with frequency, because the output impedance $Z_{OUT}$ varies with frequency, because the load 12 impedance $Z_{LOAD}$ varies with frequency, as illustrated in the load impedance frequency response of FIG. 2.

At lower values of the output current $I_{OUT}$, the direct current (DC) gain of the driver stage 13 is typically less than unity because at DC the transconductance $g_m$ of the driver stage MOSFET M1 is low and the load impedance $Z_{LOAD}$ is low. The unity gain bandwidth (UGB) of the amplifier 10 is low during this condition, i.e., at lower values of the output current $I_{OUT}$. The gain peaking, as described below with respect to FIG. 3, that may be caused by peaking within the load impedance response, e.g., as illustrated in FIG. 2, can happen beyond the UGB of the amplifier 10, which may cause instability in the amplifier 10 as a result of negative gain margin.

Figure 3:
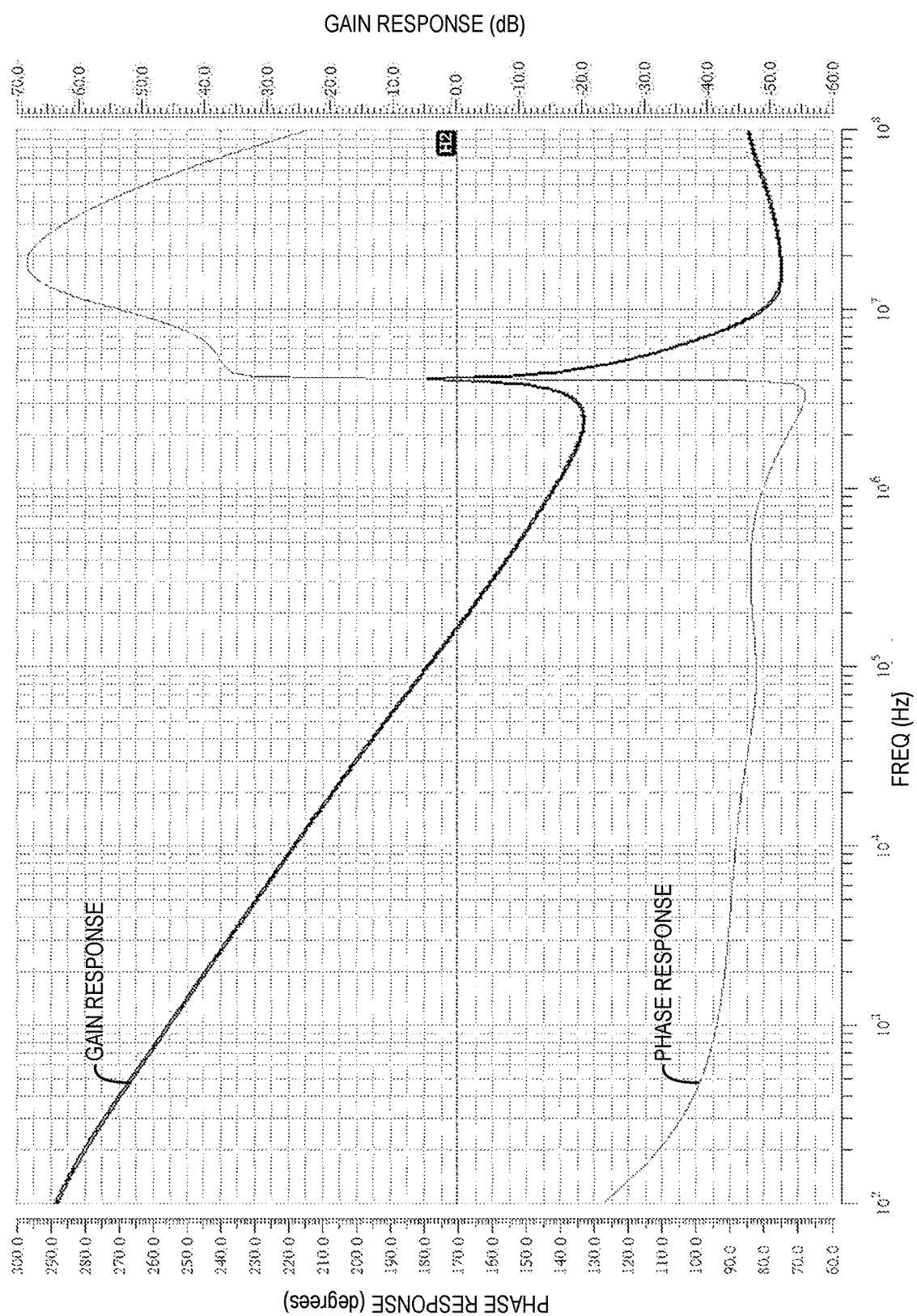
FIG. 3 is an example of a graph that illustrates high gain peaking of an amplifier such as of FIG. 1.

FIG. 3 is a graph that illustrates high gain peaking of an amplifier, such as the amplifier 10 of FIG. 1. As shown, the gain response of the amplifier, also referred to as the magnitude response, is depicted with the thicker curve, and the phase response of the amplifier is depicted with the thinner curve. The gain response scale is given in dB along the right-hand side of the graph, and the phase response scale is given in degrees along the left-hand side of the graph. Both the gain response and phase response are given as a function of frequency in Hz in a logarithmic manner along the horizontal axis. In the example of FIG. 3, the amplifier is driving, at a minimum output current, an RLC load, e.g., RLC load 12 of FIG. 1, of $R_L$=16 ohms, $L_L$=28.5 micro-Henries, and $C_L$=100 pico-Farads. In the example, the channel conductance $g_{ds}$ of the driver stage device is 25.5 micro-Siemens, i.e., the driver stage device output impedance $R_{ds}$ is 39 kilo-Ohms. As may be observed, the amplifier is unstable due to gain peaking beyond the UGB. More specifically, the gain response crosses above the unity gain line (zero dB) after the phase response rolls off, which indicates the amplifier may become unstable. Because a limitation exists in the instrument used to measure the phase response shown in FIG. 3, the phase response appears to spike vertically upward around 4 MHz, whereas in reality the phase response continues to roll off as frequency increases and reaches 0 degrees (as in FIG. 6) before the gain response rises above the unity gain line.

FIG. 1 is now referred to again. At higher values of the output current $I_{OUT}$, the DC gain of the amplifier 10 is increased due to higher transconductance $g_m$ of the driver stage MOSFET M1. At higher values of the output current $I_{OUT}$, the channel conductance $g_{ds}$ of the driver stage MOSFET M1 is also increased, which implies a decrease in the output impedance $R_{ds}$ of the driver stage MOSFET M1. The increase in transconductance $g_m$ at higher values of the output current $I_{OUT}$ increases the UGB of the amplifier 10. At high frequencies where load impedance response peaking may occur, the channel conductance $g_{ds}$ of the driver stage MOSFET M1 is increased at high values of the output current $I_{OUT}$, which means the output impedance $R_{ds}$ of the driver stage MOSFET M1 is decreased, which reduces the output impedance $R_{AMP}$ of the amplifier 10, which naturally reduces peaking in the RLC load 12 at high values of the output current $I_{OUT}$. However, at sufficiently low values of the output current $I_{OUT}$, the output impedance $R_{ds}$ of the driver stage MOSFET M1 is too large to reduce the peaking in the RLC load 12 sufficiently to make the amplifier 10 stable. For example, the 39 kilo-Ohm value of the output impedance $R_{ds}$ of the driver stage MOSFET M1 in the example of FIG. 3 is too large to sufficiently reduce the peaking in the RLC load 12 and make the amplifier 10 stable.

Figure 4:
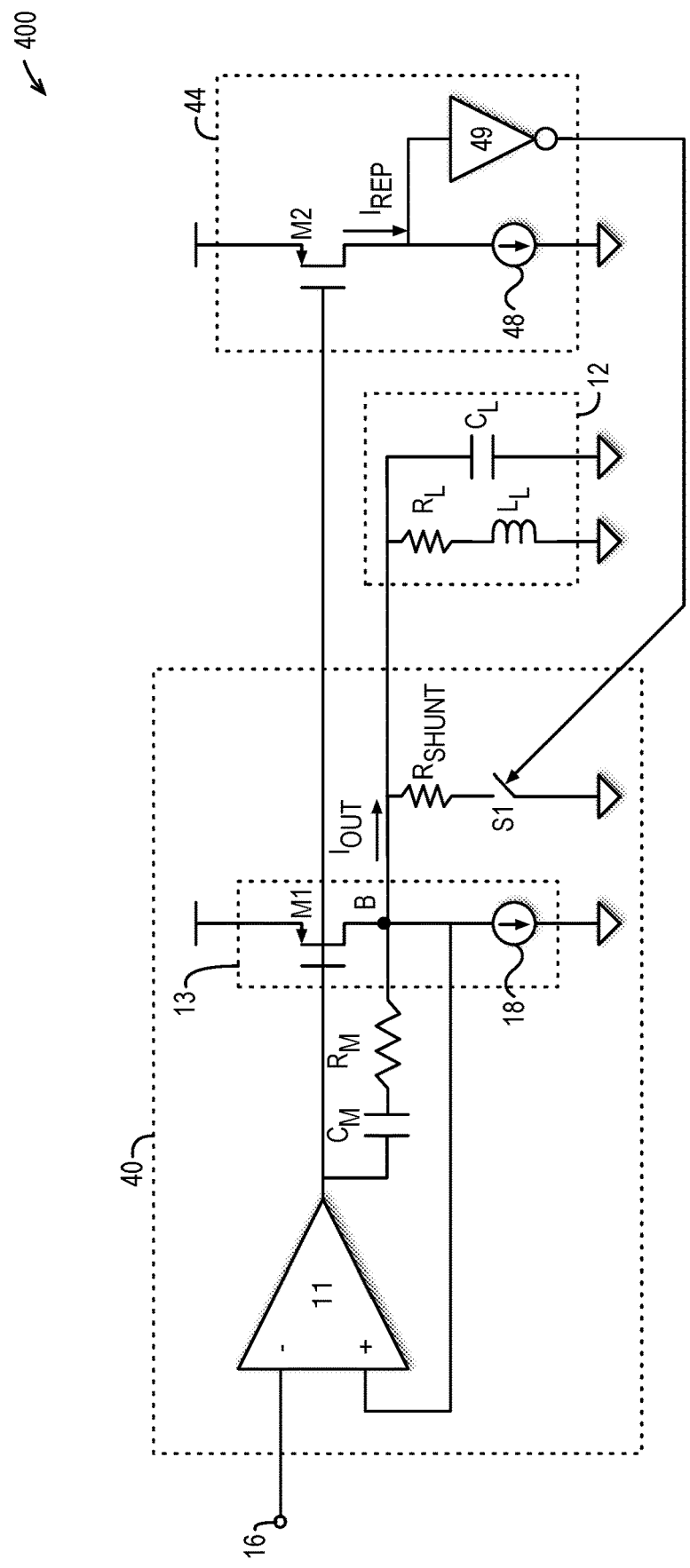
FIG. 4 is an example of a system having an amplifier driving an output current into an RLC load and a dynamic stability controller of the amplifier according to embodiments of the present disclosure.

FIG. 4 is an example of a system 400 having an amplifier 40 driving an output current $I_{OUT}$ into an RLC load 12 and a dynamic stability controller of the amplifier 40 according to embodiments of the present disclosure. The system 400 of FIG. 4 is similar in many respects to the system 100 of FIG. 1. However, the amplifier 40 includes a dynamically controllable shunt resistance $R_{SHUNT}$ and a feedback control 44.

One terminal of the shunt resistance $R_{SHUNT}$ is connected to the output node B of the amplifier 40, and the other terminal is connected to ground through a controlled switch S1 in parallel with the RLC load 12. The operation of the feedback control 44 to control the switch S1 to selectively enable the shunt resistance $R_{SHUNT}$ to shunt the RLC load 12 is described in more detail below.

When the shunt resistance $R_{SHUNT}$ is enabled to shunt the RLC load 12, it may effectively reduce the peaking in the load impedance response. A value of the shunt resistance $R_{SHUNT}$ much higher than the load 12 resistance value will not impact the DC gain of the amplifier 10; however, it may be effective in reducing the peaking, such as the gain response peaking illustrated in FIG. 3, in the gain response of the amplifier 40 and thereby compensate, or "de-Q," the load 12 to stabilize the amplifier 40 at low output current $I_{OUT}$ as described below.

Figure 5:
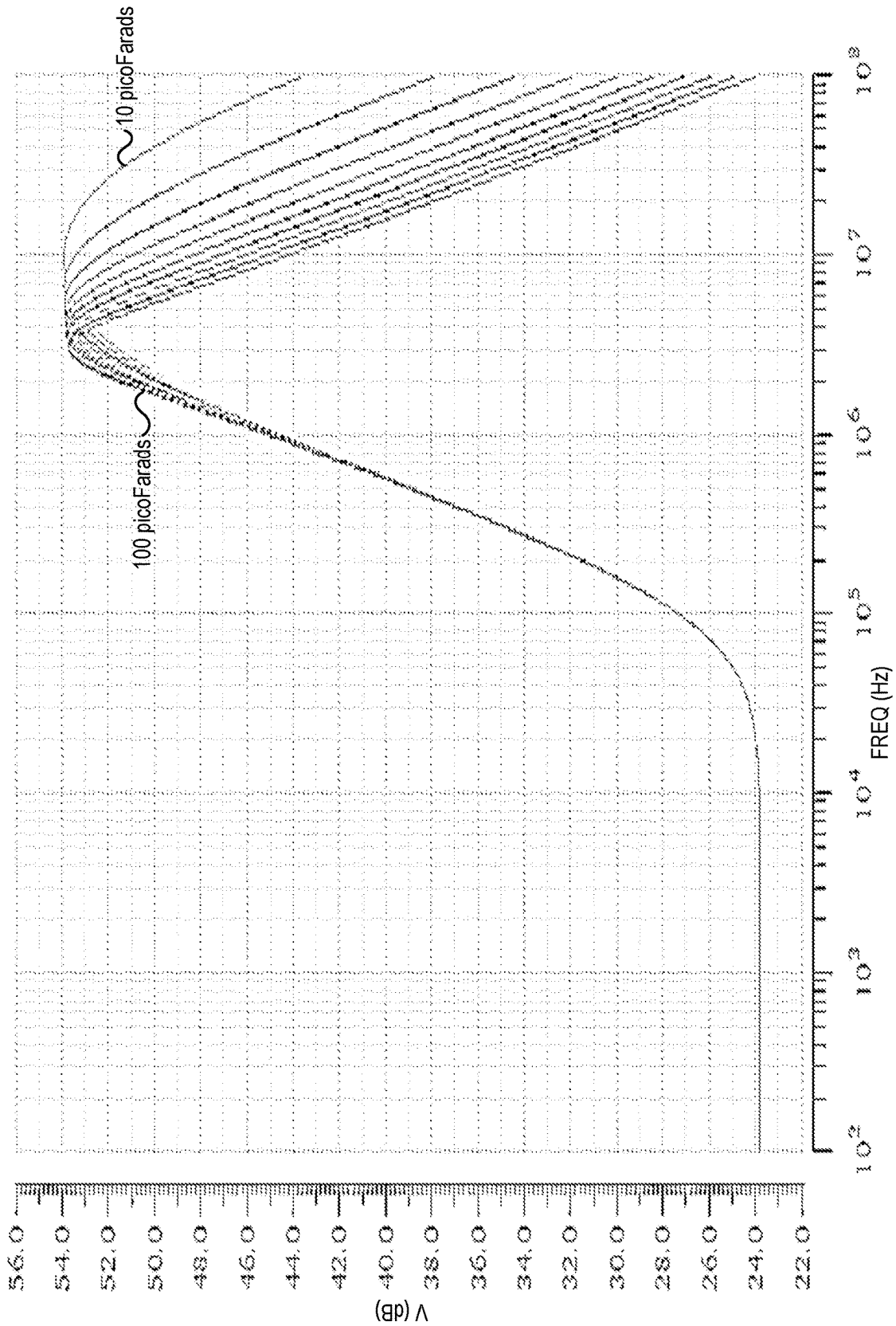
FIG. 5 is an example of a graph that illustrates a reduction in peaking of the impedance response of a high Q load according to embodiments of the present disclosure.

FIG. 5 is a graph that illustrates a reduction in peaking of the impedance response of a high Q load according to embodiments of the present disclosure. FIG. 5 is similar in many respects to FIG. 2. FIG. 5 shows an example of an impedance response of the same RLC load as in FIG. 2 (i.e., an RLC load of $R_L$=16 ohms and $L_L$=28.5 micro-Henries with $C_L$ swept from 10 pico-Farads to 100 pico-Farads in 10 pico-Farad increments), but shunted with a 500 Ohm shunt impedance, e.g., shunt resistance $R_{SHUNT}$ of FIG. 4. As may be observed by comparing the graphs of FIGS. 2 and 5, the peaking in the impedance response is reduced by about 30-50 dB in the example. As a result of the reduced impedance response peaking, the amplifier may be stabilized, an example of which is illustrated in FIG. 6.

Figure 6:
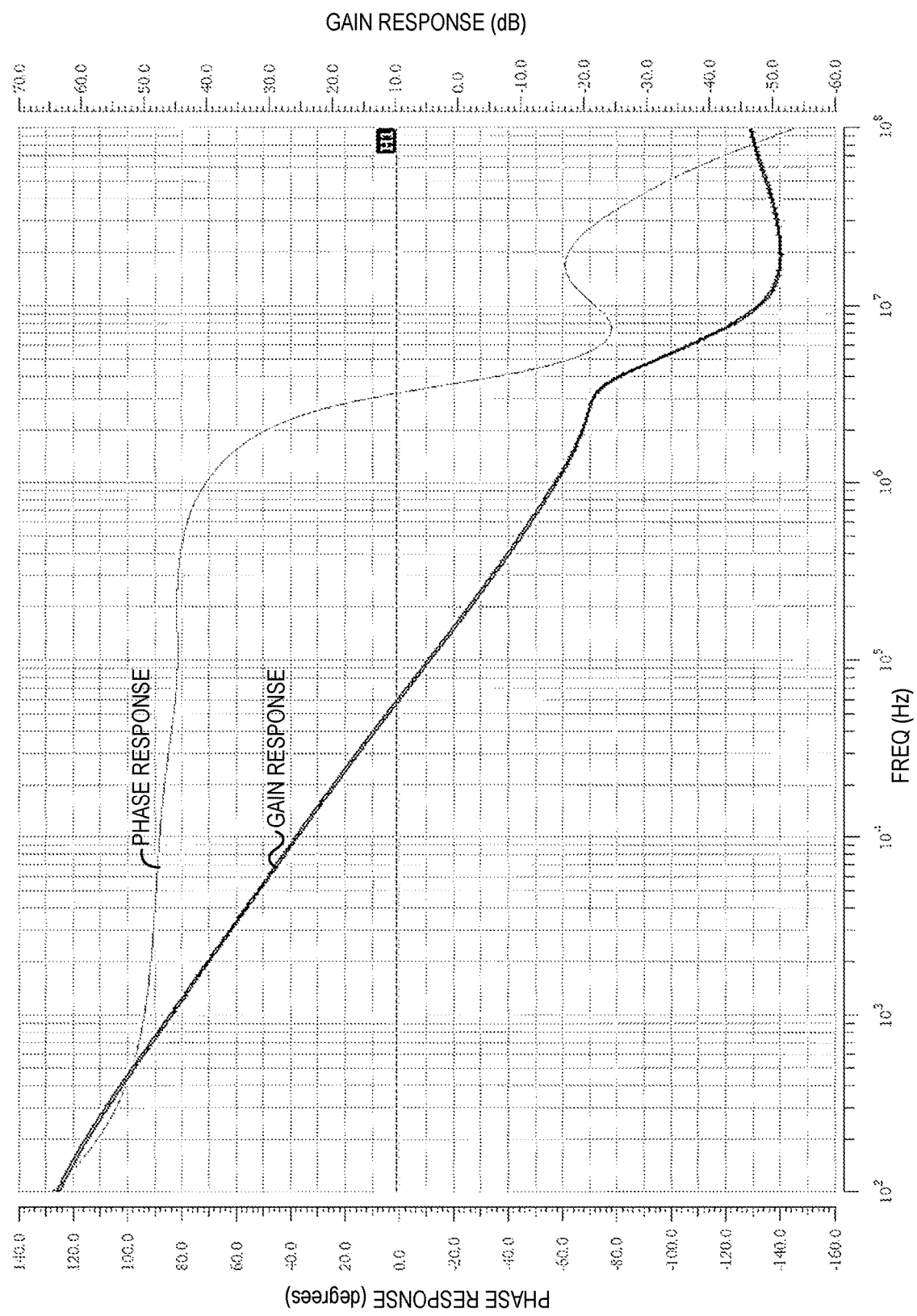
FIG. 6 is an example of a graph that illustrates reduced gain peaking of an amplifier, such as of FIG. 4, accomplished by a shunt resistance shunting the load according to embodiments of the present disclosure.

FIG. 6 is a graph that illustrates reduced gain peaking of an amplifier, such as the amplifier 40 of FIG. 4, accomplished by a shunt resistance shunting the load, e.g., shunt resistance $R_{SHUNT}$ of FIG. 4, according to embodiments of the present disclosure. FIG. 6 is similar in many respects to FIG. 3, and the amplifier is driving, at a minimum output current, the same RLC load as in FIG. 5 (i.e., an RLC load of $R_L$=16 ohms, $L_L$=28.5 micro-Henries, and $C_L$=100 pico-Farads), but shunted by a 1 kilo-Ohm shunt impedance, e.g., shunt resistance $R_{SHUNT}$ of FIG. 4. As may be observed, the amplifier is stable because the shunt impedance has removed the gain peaking present in FIG. 3 in the absence of the shunt impedance. More specifically, in the example, the gain response does not cross above the unity gain line (zero dB) after the phase response rolls off, and thus the amplifier is stable when the shunt impedance is enabled to shunt the RLC load.

FIG. 4 is now referred to again. Although the shunt resistance $R_{SHUNT}$ provides stability to the amplifier 40, if always enabled to shunt the load 12, the shunt resistance $R_{SHUNT}$ may unnecessarily degrade the power efficiency of the system 400 when the shunt resistance $R_{SHUNT}$ is not needed to stabilize the amplifier 40, e.g., when the amplifier 40 is delivering values of the output current $I_{OUT}$ above a threshold value that naturally makes the amplifier 40 stable. That is, as described above, the output impedance $R_{ds}$ of the driver stage MOSFET M1 is inversely proportional to the output current $I_{OUT}$. A sufficiently high output current $I_{OUT}$, i.e., above the threshold output current level, results in a sufficiently low output impedance $R_{ds}$ of the driver stage MOSFET M1 to act as a natural shunt to reduce the peaking inside the load 12, or "de-Q" the load 12, to make the amplifier 40 stable and make the shunt resistor $R_{SHUNT}$ unnecessary to stabilize the amplifier 40. If the shunt resistance $R_{SHUNT}$ were left enabled when the output current $I_{OUT}$ was above the stability threshold current level, then power would be unnecessarily dissipated outside the load 12 in the shunt resistance $R_{SHUNT}$.

Therefore, advantageously, in the embodiment of FIG. 4 (and the embodiment of FIG. 8) the shunt resistance $R_{SHUNT}$ may be controlled to be enabled during low output currents $I_{OUT}$ to make the amplifier 40 stable and controlled to be disabled during high output currents $I_{OUT}$ when the amplifier 40 is naturally stable, to avoid dissipating power outside the load 12 and advantageously conserve the power efficiency of the amplifier 40. More specifically, the switch S1 is controlled by the output of an inverter 49 of the feedback control 44. The feedback control 44 includes a current mirror M2 that replicates the output current $I_{OUT}$ through the driver stage MOSFET M1. The current mirror embodiment of FIG. 4 includes a P-channel MOSFET M2 having its source connected to the source voltage, its drain connected to a ground side stability threshold current source 48, and its gate connected to the gate of the driver stage MOSFET M1.

The drain of the current mirror M2 is also connected to the input of the inverter 49. Thus, the replicated current $I_{REP}$ is compared against the fixed stability threshold current level 48 such that when the replicated current $I_{REP}$ is higher than the threshold current, the input to the inverter 49 will go high and its output will go low; otherwise, the input to the inverter 49 will go low and its output will go high. In this manner, the inverter 49 effectively operates as a current comparator that closes the switch S1 when the replicated current $I_{REP}$, and therefore the output current $I_{OUT}$, is lower than the stability threshold current 48 in order to enable the shunt resistance $R_{SHUNT}$ to shunt the RLC load 12; conversely, the inverter 49 opens the switch S1 when the replicated current $I_{REP}$, and therefore the output current $I_{OUT}$, is higher than the stability threshold current 48 in order to disable the shunt resistance $R_{SHUNT}$ from shunting the RLC load 12 and avoid needlessly dissipating power in the shunt resistance $R_{SHUNT}$. Thus, because the shunt resistance $R_{SHUNT}$ is selectively enabled/disabled based on the sensed level of the output current $I_{OUT}$, i.e., the comparison of the output current $I_{OUT}$ with the stability threshold current 48, the shunt resistance $R_{SHUNT}$ control of FIG. 4 may be characterized as a feedback control 44.

Figure 7:
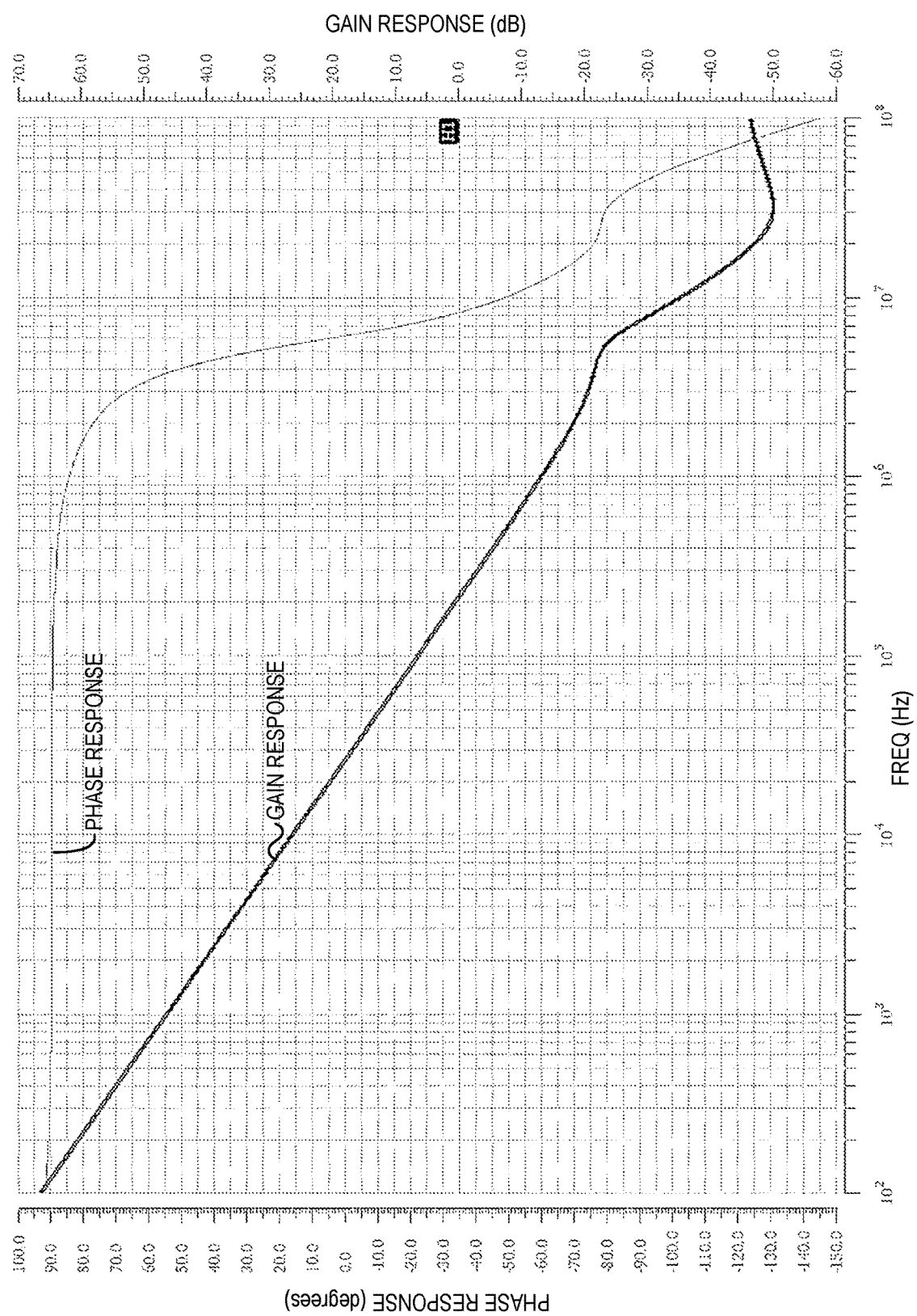
FIG. 7 is an example of a graph that illustrates stability of an amplifier, such as of FIG. 4, at a sufficiently high output current with power efficiency accomplished by selectively disabling a shunt resistance shunting the load according to embodiments of the present disclosure.

FIG. 7 is a graph that illustrates stability of an amplifier, such as the amplifier 40 of FIG. 4, at a sufficiently high output current with power efficiency accomplished by selectively disabling a shunt resistance shunting the load, e.g., shunt resistance $R_{SHUNT}$ of FIG. 4, according to embodiments of the present disclosure. FIG. 7 is similar in many respects to FIG. 6, and the amplifier is driving, at a high output current, the same RLC load as in FIG. 6 (i.e., an RLC load of $R_L$=16 ohms, $L_L$=28.5 micro-Henries, and $C_L$=100 pico-Farads), with the shunt impedance disabled, e.g., the shunt resistance $R_{SHUNT}$ of FIG. 4 is disabled by the switch S1 being opened. As may be observed, the amplifier is stable because the output impedance $R_{ds}$ of the driver stage MOSFET M1 acts as a natural shunt to the load 12 by virtue of the small signal ground through the supply, as described above. More specifically, in the example, the channel conductance $g_{ds}$ of the driver stage device is 452 micro-Siemens, i.e., the driver stage device output impedance $R_{ds}$ is 2.2 kilo-Ohms. As shown, the gain response does not cross the unity gain line (zero dB) after the phase response rolls off, which indicates the amplifier is stable. Thus, an advantage of the system 400 is that it may provide reduced power consumption by disabling the shunt resistance $R_{SHUNT}$ when the value of the output current renders the shunt resistance $R_{SHUNT}$ unnecessary to stabilize the amplifier 40, e.g., when the output current is above the stability threshold current 48 value, such that power is not needlessly dissipated in the shunt resistance $R_{SHUNT}$.

Figure 8:
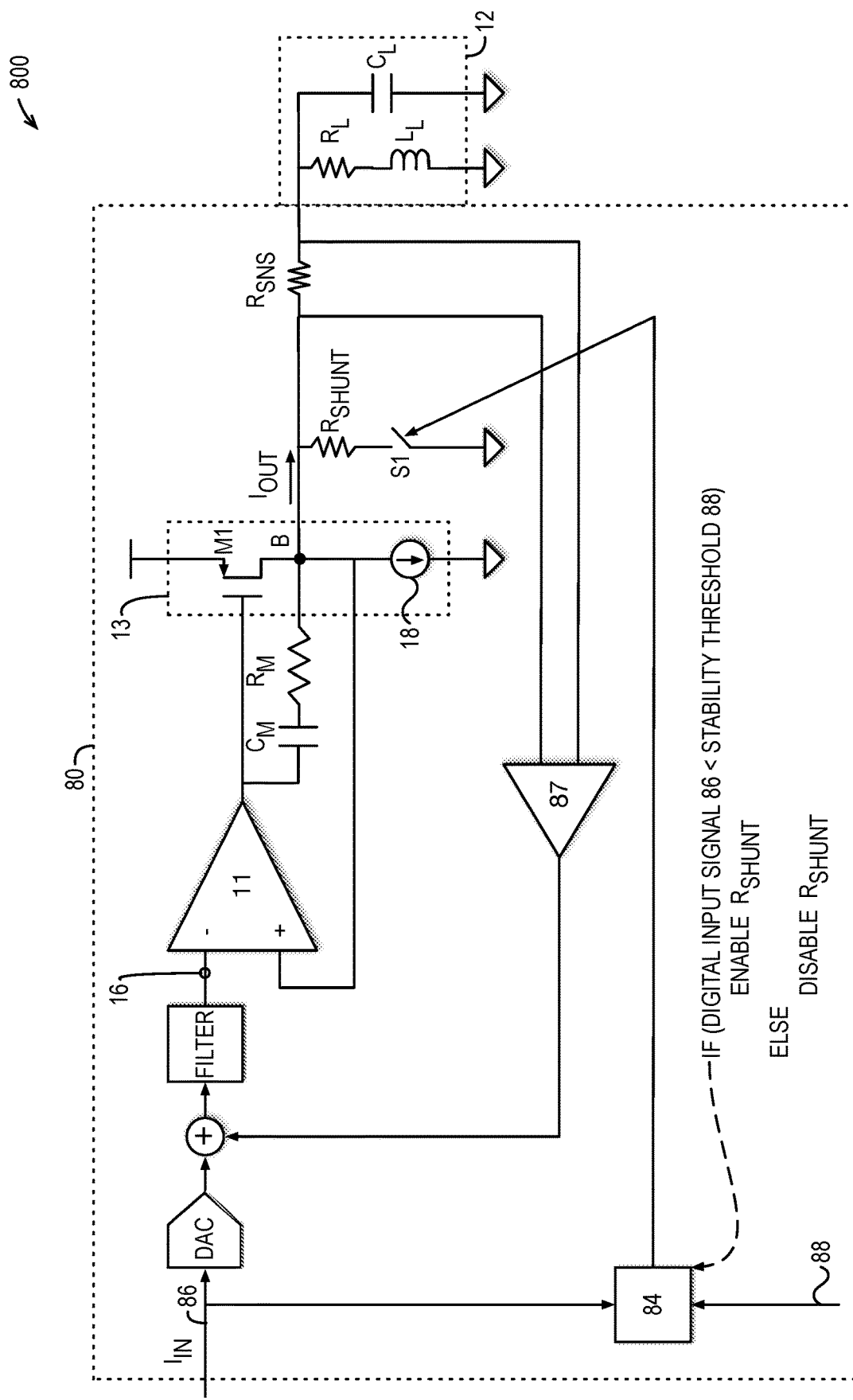
FIG. 8 is an example of a system having an amplifier driving an output current into an RLC load and a dynamic stability controller of the amplifier according to embodiments of the present disclosure.

FIG. 8 is an example of a system 800 having an amplifier 80 driving an output current $I_{OUT}$ into an RLC load 12 and a dynamic stability controller of the amplifier 80 according to embodiments of the present disclosure. The system 800 of FIG. 8 is similar in many respects to the system 400 of FIG. 4. However, the system 800, rather than including a feedback control, includes a feedforward control 84 to control the switch S1 that selectively enables or disables the shunt resistance $R_{SHUNT}$ from shunting the RLC load 12 to provide dynamic stability control for the amplifier 80.

In the system 800 of FIG. 8, the amplifier 80 is a current amplifier. The amplifier 80 includes a sense resistor $R_{SNS}$ that senses the output current $I_{OUT}$ and the voltage across the sense resistor $R_{SNS}$ is amplified by a current sense amplifier 87 and provided to a summing element. A digital input current signal $I_{IN}$ 86 is provided to a digital-to-analog converter (DAC) whose analog output is also provided to the summing element. The output of the summing element is provided to a filter that outputs the analog input signal 16 to the amplifier 80. The output current $I_{OUT}$ is set by the digital input current signal $I_{IN}$ 86 independently of the RLC load 12. The feedback loop that includes the sense resistor $R_{SNS}$, current sense amplifier 87, summing element and filter operates to make the voltage fed back by the current sense amplifier 87 equal to the output of the DAC. In one embodiment, the system 800 that includes the current amplifier 80 is similar to that described in U.S. patent application Ser. No. 16/431,276 filed on Jun. 4, 2019, which is hereby incorporated by reference for all purposes.

The feedforward control 84 receives the digital input current signal $I_{IN}$ 86 and compares it with a digital stability threshold current value 88. As stated above, the digital input current signal level $I_{IN}$ 86 sets the output current $I_{OUT}$ level independently of the RLC load 12. Therefore, the digital input current signal level $I_{IN}$ 86 is an indication of the output current $I_{OUT}$ level. When the digital input current signal $I_{IN}$ 86, indicative of the output current $I_{OUT}$ level, is lower than the digital stability threshold current value 88, the feedforward control 84 closes the switch S1 in order to enable the shunt resistance $R_{SHUNT}$ to shunt the RLC load 12 to stabilize the amplifier 80. Conversely, when the digital input current signal hr 86 is higher than the digital stability threshold current value 88, the feedforward control 84 opens the switch S1 in order to disable the shunt resistance $R_{SHUNT}$ from shunting the RLC load 12 to save power from being consumed by the shunt resistance $R_{SHUNT}$. Thus, because the shunt resistance $R_{SHUNT}$ is selectively enabled/disabled based on a comparison with the digital stability threshold current 88 of the digital input current signal $I_{IN}$ 86 (which is indicative of the output current $I_{OUT}$), the shunt resistance $R_{SHUNT}$ control of FIG. 8 may be characterized as a feedforward control 84.

Thus, similar to the description above with respect to FIG. 4, at sufficiently high output current $I_{OUT}$ levels, as determined by the digital input current signal $I_{IN}$ 86 level, when the current amplifier 80 is naturally stable due to the sufficiently low driver stage device output impedance $R_{ds}$, the shunt resistance $R_{SHUNT}$ is disabled in order to not degrade power efficiency.

Embodiments have been described above with respect to FIGS. 4 and 8 in which a shunt resistance is dynamically enabled parallel to the RLC load being driven by the amplifier as needed to compensate for the high peaking impedance response of the RLC load to reduce the peaking in the resultant impedance response of the RLC load and shunt resistor combination and in this manner to provide dynamic stability control for the amplifier. In one embodiment, the amplifier is embodied in an integrated circuit, the RLC load is external and connected to the integrated circuit, and the controllable shunt resistor $R_{SHUNT}$ is included within the integrated circuit.

Figure 9:
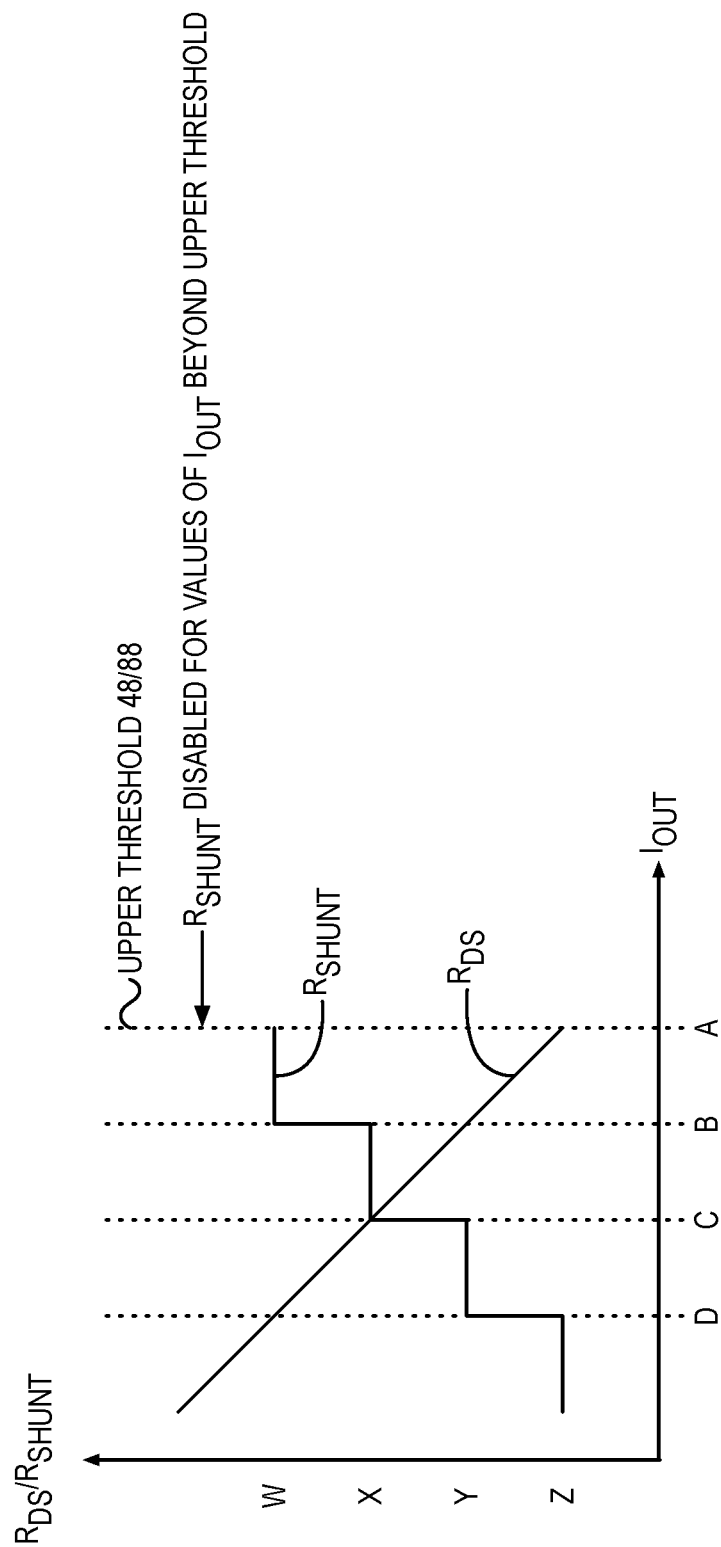
FIG. 9 is an example of a graph illustrating an alternate embodiment in which the shunt resistance has a controllable variable resistance value according to embodiments of the present disclosure.

FIG. 9 is a graph illustrating an alternate embodiment in which the shunt resistance $R_{SHUNT}$, e.g., of FIG. 4 or FIG. 8, has a controllable variable resistance value according to embodiments of the present disclosure. That is, the shunt resistance $R_{SHUNT}$ is controllable at a given time to have one of multiple possible resistance values. Additionally, the feedback/feedforward control 44/84 of FIG. 4/8 receives multiple stability thresholds including the upper stability threshold level 48/88 of FIG. 4/8 and one or more additional stability thresholds that are lower than the upper stability threshold 48/88. The multiple resistance values of the shunt resistance $R_{SHUNT}$ correspond to the multiple stability thresholds.

As described above, the output impedance $R_{ds}$ of the driver stage MOSFET M1 is inversely proportional to the output current $I_{OUT}$, as shown in the graph of FIG. 9. As also described above, the shunt resistance $R_{SHUNT}$ is needed or not needed to shunt the RLC load 12 to stabilize the amplifier 40/80 depending upon whether the output impedance $R_{ds}$ of the driver stage MOSFET M1, which is determined by the level of the output current $I_{OUT}$, is sufficient to operate as a small signal shunt of the RLC load 12 to stabilize the amplifier 40/80. FIG. 9 illustrates the manner in which the feedback/feedforward control 44/84 controls the resistance value of the shunt resistance $R_{SHUNT}$ as a function of output current $I_{OUT}$, more specifically, to be proportional to the output current $I_{OUT}$. When the output current $I_{OUT}$ rises above the upper stability threshold level (e.g., 48/88 of FIG. 4/8) at which the shunt resistance $R_{SHUNT}$ is not needed to stabilize the amplifier 40/80 because the output impedance $R_{ds}$ of the driver stage MOSFET M1 is sufficiently small to stabilize the amplifier 40/80, the control 44/84 disables the shunt resistance $R_{SHUNT}$ entirely, as described above with respect to FIG. 4/8. Otherwise, the control 44/84 enables the variable shunt resistance $R_{SHUNT}$ and increases/decreases its variable resistance value as the output current $I_{OUT}$ level rises above/falls below the relevant one of the multiple thresholds. For example, assume four thresholds A, B, C and D (A being the highest, D being the lowest) and four corresponding resistance values W, X, Y and Z (W being the highest, Z being the lowest), as shown in FIG. 9. When the output current level $I_{OUT}$ is below threshold C, for example, then the control 44/84 enables the shunt resistance $R_{SHUNT}$ and selects its resistance at value Y, since C is the lowest of the thresholds that the output current $I_{OUT}$ is below, and Y corresponds to C. In this manner, the variable-valued shunt resistance embodiment may save additional power over a single-valued shunt resistance embodiment (e.g., of FIG. 4/8) because less current will flow through the shunt resistance, and a smaller amount of power will be dissipated outside the load. That is, in the case of a single-valued shunt resistance embodiment, the shunt resistance value is preferably the value needed to stabilize the amplifier at the minimum output current level, which will be a relatively small resistance value, resulting in a relatively large current flowing through the shunt resistance. Whereas, in the multi-valued shunt resistance embodiment, the higher the output current level, i.e., the closer the output current level to the upper stability threshold current level, the larger the shunt resistance value may be (relative to the single shunt resistor value), which causes a smaller amount of the output current to flow through the shunt resistance.

Figure 10:
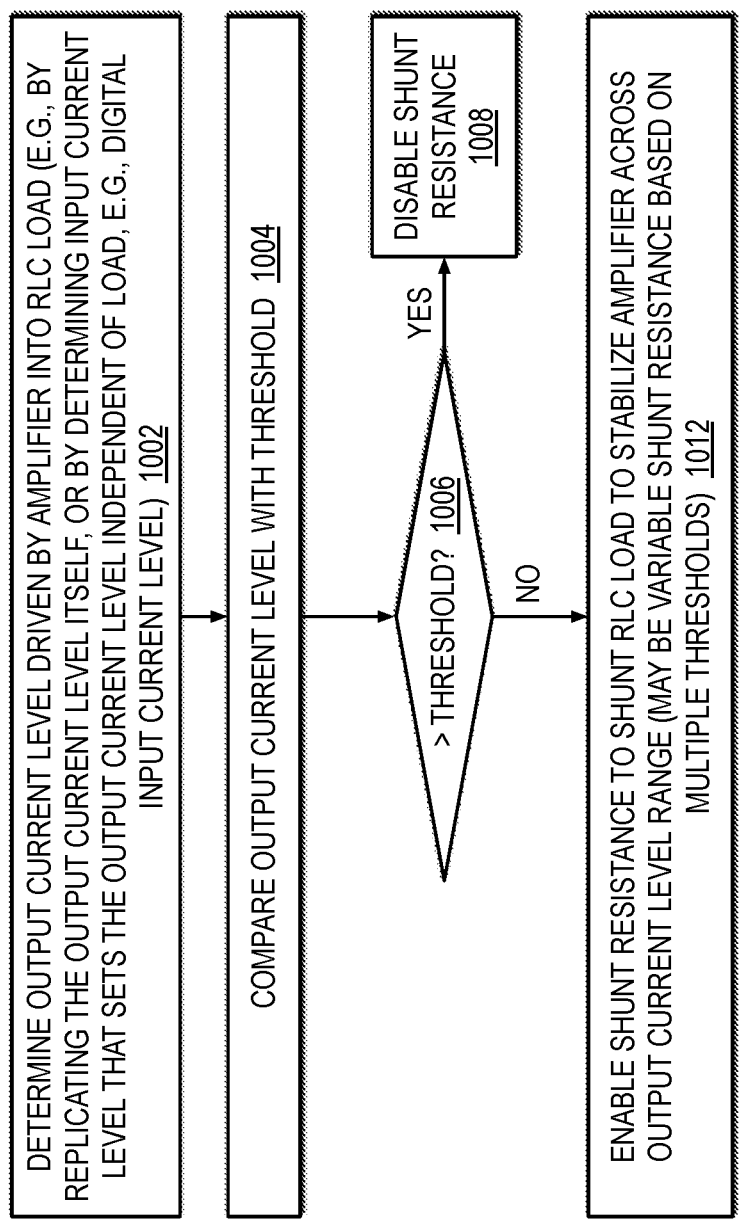
FIG. 10 is an example of a flowchart illustrating operation of a system that includes a dynamically stabilizable amplifier for driving an output current into a RLC load according to embodiments of the present disclosure.

FIG. 10 is a flowchart illustrating operation of a system that includes a dynamically stabilizable amplifier for driving an output current into an RLC load according to embodiments of the present disclosure.

At block 1002, the output current level (e.g., output current $I_{OUT}$ of FIG. 4 or 8) is determined (e.g., by control circuit 44 of FIG. 4 or 84 of FIG. 8). In one embodiment, the output current level is determined by replicating the output current (e.g., by current mirror M2 of FIG. 4). In another embodiment, the output current level is determined by determining an input current level that sets the output current level independent of the RLC load (e.g., digital input current signal $I_{IN}$ 86 of FIG. 8). The operation proceeds to block 1004.

At block 1004, the output current level is compared with a threshold (e.g., stability threshold 48 of FIG. 4 or 88 of FIG. 8). The operation proceeds to decision block 1006.

At decision block 1006, if the output current level is greater than the threshold, operation proceeds to block 1008; otherwise, operation proceeds to block 1012.

At block 1008, a shunt resistance (e.g., shunt resistance $R_{SHUNT}$ of FIG. 4 or 8) is disabled (e.g., switch S1 is opened) in order to prevent the shunt resistance from shunting the RLC load in order to improve the power efficiency of the amplifier.

At block 1012, the shunt resistance is enabled to shunt the RLC load in order to stabilize the amplifier across a range of output current levels, i.e., even when the amplifier would otherwise be unstable, e.g., at low values of the input current. In one embodiment, the resistance value of the shunt resistor is variable, and enabling the shunt resistance includes comparing the output current to multiple thresholds and setting the shunt resistor value based on the comparison in order to use highest possible value of the multiple shunt resistances that will still stabilize the amplifier in order to dissipate as minimum power as possible in the shunt resistance and outside the load.

Figure 11:
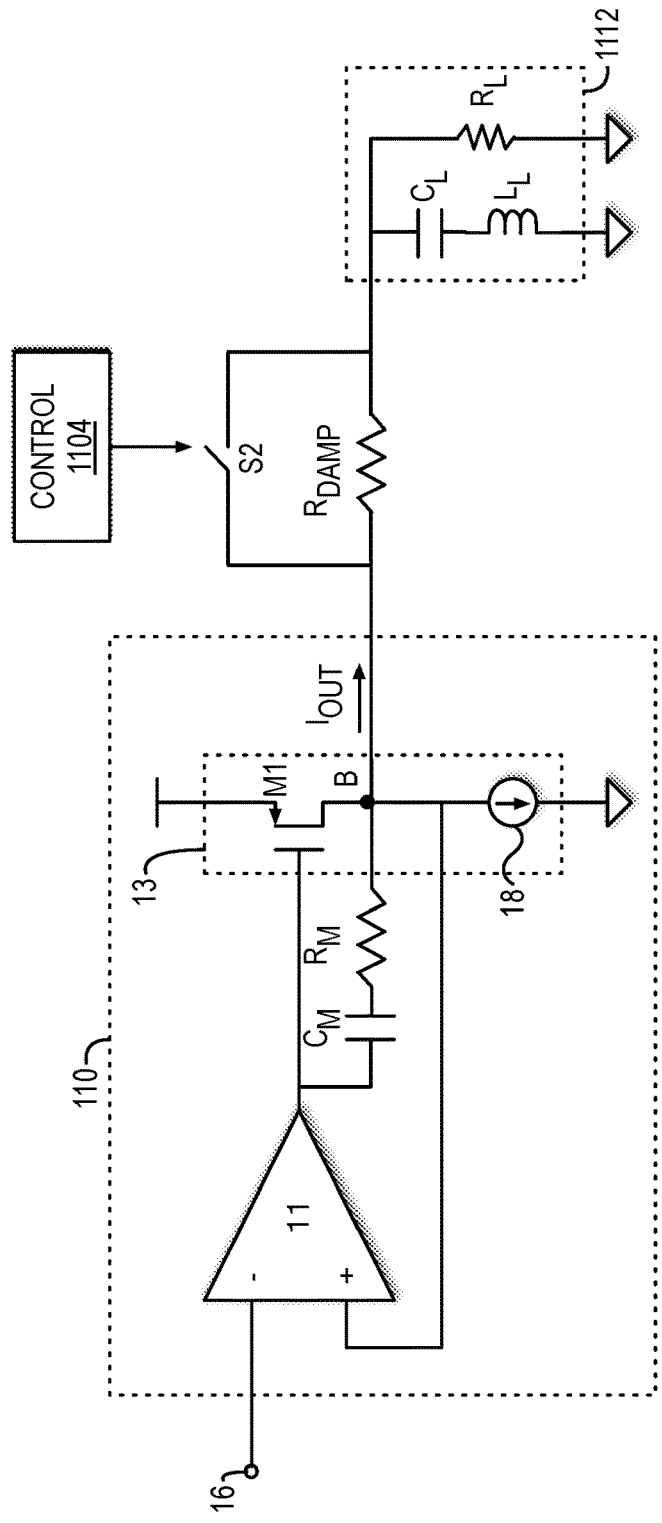
FIG. 11 is an example of a system having an amplifier driving an output current into an RLC load and a dynamic stability controller of the amplifier according to embodiments of the present disclosure.

FIG. 11 is an example of a system 1100 having an amplifier 110 driving an output current $I_{OUT}$ into an RLC load 1112 and a dynamic stability controller of the amplifier 110 according to embodiments of the present disclosure. The system 1100 of FIG. 11 is similar in many respects to the system 400 of FIG. 4. However, the RLC load 1112 is represented in FIG. 11 as a load capacitor $C_L$ in series with a load inductor $L_L$, which are in parallel with a load resistor $R_L$. In particular, the RLC load 1112 has a low valley impedance response, in contrast to the high peaking RLC load 12 of FIG. 1. To dampen the valleys in the impedance response of the RLC load 1112, the amplifier 110 includes a dynamically controllable damping resistance $R_{DAMP}$ and a control 1104. One terminal of the damping resistance $R_{DAMP}$ is connected to the output node B of the amplifier 110, and the other terminal is connected to the RLC load 1112. A controlled switch S2 is in parallel with the damping resistance $R_{DAMP}$. The control 1104 may operate to control the switch S2 to selectively enable the damping resistance $R_{DAMP}$ to be placed in series with the RLC load 1112 (i.e., switch S2 is open) and selectively thereby dampen the valleys in the impedance response of the RLC load 1112 to stabilize the amplifier 110 or to selectively disable the damping resistance $R_{DAMP}$ (i.e., switch S2 is closed) to save power when the damping resistance $R_{DAMP}$ is not needed to compensate for the valleys and stabilize the amplifier 110.

The output impedance $Z_{OUT}$ of the system 1100 viewed at the output node B of the amplifier 10 is effectively the impedance $Z_{LOAD}$ of the RLC load 12 in series with the output impedance $R_{AMP}$ of the amplifier 10 in series with the damping resistor $R_{DAMP}$, when enabled. As described above, the gain of the output driver stage 13 is the product of the system output impedance $Z_{OUT}$ and the transconductance $g_m$ of the driver stage MOSFET M1. In a system without the damping resistor $R_{DAMP}$, at low values of the output current $I_{OUT}$, the transconductance ($g_m$) of the output driver stage 13 is low which can cause a low gain condition that may result in instability of the amplifier 110. Enabling the damping resistor $R_{DAMP}$ to be in series with the RLC load 1112 may improve the gain in the output driver stage 13 by limiting the minimum impedance at its output. That is, when the damping resistance $R_{DAMP}$ is enabled to be in series with the RLC load 1112, the system output impedance $Z_{OUT}$ is increased, which may be effective in dampening the valleys in the gain response of the amplifier 110 and thereby compensate the load 1112 to stabilize the amplifier 110 at low output current $I_{OUT}$.

Although the damping resistance $R_{DAMP}$ provides stability to the amplifier 110, if always enabled in series with the load 1112, the damping resistance $R_{DAMP}$ may unnecessarily degrade the power efficiency of the system 1100 when the damping resistance $R_{DAMP}$ is not needed to stabilize the amplifier 110, e.g., when the amplifier 110 is delivering values of the output current $I_{OUT}$ above a threshold value that naturally makes the amplifier 110 stable by making the transconductance $g_m$ of the output driver stage 13 sufficiently high to provide the gain required to make the amplifier 110 stable. If the damping resistance $R_{DAMP}$ were left enabled when the output current $I_{OUT}$ was above the stability threshold current level, then power would unnecessarily be dissipated outside the load 1112 in the damping resistance $R_{DAMP}$.

Therefore, advantageously, in the embodiment of FIG. 11, the damping resistance $R_{DAMP}$ may be controlled to be enabled (e.g., by opening switch S2) during low output currents $I_{OUT}$ to make the amplifier 110 stable and controlled to be disabled (e.g., by closing switch S2) during high output currents $I_{OUT}$ when the amplifier 110 is naturally stable, to avoid dissipating power outside the load 1112 and advantageously conserve the power efficiency of the amplifier 110 and deliver more power to the load 1112.

Although a generic control 1104 is shown in FIG. 11 to control switch S2, both feedback and feedforward embodiments are contemplated similar to those of FIGS. 4 and 8 above. Additionally, embodiments are contemplated in which the damping resistance $R_{DAMP}$ has a controllable variable resistance value similar to that described with respect to FIG. 9 above. More specifically, the higher the output current level, i.e., the closer the output current level to the upper stability threshold current level, the smaller the damping resistance value may be (relative to the single damping resistor value), which causes the damping resistance to dissipate less power, which may save additional power over a single-valued damping resistance embodiment (e.g., of FIG. 11). Finally, operation of the system 1100 to dynamically stabilizable the amplifier 110 for driving an output current into the RLC load 1112 may be similar to that described with respect to FIG. 10, except that at blocks 1008 and 1012 the damping resistance $R_{DAMP}$ (as opposed to the shunt resistance $R_{SHUNT}$) is disabled and enabled, respectively.

It should be understood—especially by those having ordinary skill in the art with the benefit of this disclosure— that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. A dynamically stabilizable amplifier for driving an output current into a resistive, inductive, and capacitive (RLC) load, comprising:
   a driver stage that generates the output current on an output;
   a stabilizing resistor at the output of the driver stage; and
   a control circuit that:
      determines a level of the output current of the amplifier;
      compares the output current level with one or more thresholds; and
      selectively enables the stabilizing resistor based on the comparison so that the amplifier is stable across a range of the output current level;
   wherein the RLC load comprises a load resistance in series with a load inductance, which are in parallel with a load capacitance;
   wherein the stabilizing resistor is a shunt resistor; and
   wherein to selectively enable the stabilizing resistor based on the comparison, the control circuit controls the shunt resistor to selectively shunt the RLC load based on the comparison so that the amplifier is stable across a range of the output current level.

2. The amplifier of claim 1,
   wherein the RLC load comprises a load capacitance in series with a load inductance, which are in parallel with a load resistance;
   wherein the stabilizing resistor is a damping resistor; and
   wherein to selectively enable the stabilizing resistor based on the comparison, the control circuit controls the damping resistor to selectively be in series with the RLC load based on the comparison so that the amplifier is stable across a range of the output current level.

3. The amplifier of claim 1,
   wherein the stabilizing resistor that has a resistance value that stabilizes the amplifier when the stabilizing resistor is enabled.

4. The amplifier of claim 1,
   wherein the control circuit:
      disables the stabilizing resistor when the output current level is above a highest of the one or more thresholds; and
      enables the stabilizing resistor when the output current level is below the highest of the one or more thresholds.

5. The amplifier of claim 4,
   wherein the one or more thresholds comprise a plurality of thresholds;
   wherein the stabilizing resistor is controllable to have a plurality of resistance values corresponding to the plurality of thresholds; and
   wherein to enable the stabilizing resistor when the output current level is below the highest of the one or more thresholds, the control circuit:
      controls the stabilizing resistor to have one of the plurality of resistance values corresponding to a lowest one of the plurality of thresholds that the output current level is below.

6. The amplifier of claim 1,
   wherein to determine the level of the output current of the amplifier, the control circuit:
      replicates the output current of the amplifier; and
      determines a level of the replicated output current; and
   wherein to compare the output current level with one or more thresholds, the control circuit:
      compares the replicated output current level with the one or more thresholds.

7. The amplifier of claim 1,
   wherein an input current level received by the amplifier sets the output current level independent of the RLC load;
   wherein to determine the level of the output current of the amplifier, the control circuit:
      determines the input current level; and
   wherein to compare the output current level with one or more thresholds, the control circuit:
      compares the input current level with the one or more thresholds.

8. The amplifier of claim 7,
wherein the input current level and the one or more thresholds are digital values.

9. A method for dynamically stabilizing an amplifier driving an output current into a resistive, inductive, and capacitive (RLC) load, comprising:
determining a level of the output current of the amplifier;
comparing the output current level with one or more thresholds; and
selectively enabling a stabilizing resistor at an output of the driver stage based on said comparing so that the amplifier is stable across a range of the output current level;
wherein the RLC load comprises a load resistance in series with a load inductance, which are in parallel with a load capacitance;
wherein the stabilizing resistor is a shunt resistor; and
wherein said selectively enabling the stabilizing resistor at the output of the driver stage based on said comparing comprises controlling the shunt resistor to selectively shunt the RLC load based on the comparison so that the amplifier is stable across a range of the output current level.

10. The method of claim 9,
wherein the RLC load comprises a load capacitance in series with a load inductance, which are in parallel with a load resistance;
wherein the stabilizing resistor is a damping resistor; and
wherein said selectively enabling the stabilizing resistor at the output of the driver stage based on said comparing comprises controlling the damping resistor to selectively be in series with the RLC load based on the comparison so that the amplifier is stable across a range of the output current level.

11. The method of claim 9,
wherein the stabilizing resistor that has a resistance value that stabilizes the amplifier when the stabilizing resistor is enabled.

12. The method of claim 9,
wherein said selectively enabling the stabilizing resistor based on said comparing comprises:
disabling the stabilizing resistor when the output current level is above a highest of the one or more thresholds; and
enabling the stabilizing resistor when the output current level is below the highest of the one or more thresholds.

13. The method of claim 12,
wherein the one or more thresholds comprise a plurality of thresholds;
wherein the stabilizing resistor is controllable to have a plurality of resistance values corresponding to the plurality of thresholds; and
wherein said enabling the stabilizing resistor when the output current level is below the highest of the one or more thresholds comprises:
controlling the stabilizing resistor to have one of the plurality of resistance values corresponding to a lowest one of the plurality of thresholds that the output current level is below.

14. The method of claim 9,
wherein said determining the level of the output current of the amplifier comprises:
replicating the output current of the amplifier; and
determining a level of the replicated output current; and
wherein said comparing the output current level with one or more thresholds comprises:
comparing the replicated output current level with the one or more thresholds.

15. The method of claim 9, further comprising:
receiving an input current level that sets the output current level independent of the RLC load;
wherein said determining the level of the output current of the amplifier comprises:
determining the input current level; and
wherein said comparing the output current level with one or more thresholds comprises:
comparing the input current level with the one or more thresholds.

16. The method of claim 15,
wherein the input current level and the one or more thresholds are digital values.

17. A non-transitory computer-readable medium having instructions stored thereon that are capable of causing or configuring a dynamically stabilizable amplifier for driving an output current into a resistive, inductive, and capacitive (RLC) load, comprising:
a driver stage that generates the output current on an output;
a stabilizing resistor at the output of the driver stage; and
a control circuit that:
determines a level of the output current of the amplifier;
compares the output current level with one or more thresholds; and
selectively enables the stabilizing resistor based on the comparison so that the amplifier is stable across a range of the output current level;
wherein the RLC load comprises a load resistance in series with a load inductance, which are in parallel with a load capacitance;
wherein the stabilizing resistor is a shunt resistor; and
wherein to selectively enable the stabilizing resistor based on the comparison, the control circuit controls the shunt resistor to selectively shunt the RLC load based on the comparison so that the amplifier is stable across a range of the output current level.

18. The non-transitory computer-readable medium of claim 17,
wherein the control circuit:
disables the stabilizing resistor when the output current level is above a highest of the one or more thresholds; and
enables the stabilizing resistor when the output current level is below the highest of the one or more thresholds.

19. A dynamically stabilizable amplifier for driving an output current into a resistive, inductive, and capacitive (RLC) load, comprising:
a driver stage that generates the output current on an output;
a stabilizing resistor at the output of the driver stage; and
a control circuit that:
determines a level of the output current of the amplifier;
compares the output current level with one or more thresholds; and
selectively enables the stabilizing resistor based on the comparison so that the amplifier is stable across a range of the output current level;
wherein the RLC load comprises a load capacitance in series with a load inductance, which are in parallel with a load resistance;
wherein the stabilizing resistor is a damping resistor; and
wherein to selectively enable the stabilizing resistor based on the comparison, the control circuit controls the damping resistor to selectively be in series with the RLC load based on the comparison so that the amplifier is stable across a range of the output current level.

20. A method for dynamically stabilizing an amplifier driving an output current into a resistive, inductive, and capacitive (RLC) load, comprising:
   determining a level of the output current of the amplifier;
   comparing the output current level with one or more thresholds; and
   selectively enabling a stabilizing resistor at an output of the driver stage based on said comparing so that the amplifier is stable across a range of the output current level;
   wherein the RLC load comprises a load capacitance in series with a load inductance, which are in parallel with a load resistance;
   wherein the stabilizing resistor is a damping resistor; and
   wherein said selectively enabling the stabilizing resistor at the output of the driver stage based on said comparing comprises controlling the damping resistor to selectively be in series with the RLC load based on the comparison so that the amplifier is stable across a range of the output current level.

21. A dynamically stabilizable amplifier for driving an output current into a resistive, inductive, and capacitive (RLC) load, comprising:
   a driver stage that generates the output current on an output;
   a stabilizing resistor at the output of the driver stage; and
   a control circuit that:
      determines a level of the output current of the amplifier;
      compares the output current level with one or more thresholds; and
      selectively enables the stabilizing resistor based on the comparison so that the amplifier is stable across a range of the output current level;
   wherein to determine the level of the output current of the amplifier, the control circuit:
      replicates the output current of the amplifier; and
      determines a level of the replicated output current; and
   wherein to compare the output current level with one or more thresholds, the control circuit:
      compares the replicated output current level with the one or more thresholds.

22. A method for dynamically stabilizing an amplifier driving an output current into a resistive, inductive, and capacitive (RLC) load, comprising:
   determining a level of the output current of the amplifier;
   comparing the output current level with one or more thresholds; and
   selectively enabling a stabilizing resistor at an output of the driver stage based on said comparing so that the amplifier is stable across a range of the output current level;
   wherein said determining the level of the output current of the amplifier comprises:
      replicating the output current of the amplifier; and
      determining a level of the replicated output current; and
   wherein said comparing the output current level with one or more thresholds comprises:
      comparing the replicated output current level with the one or more thresholds.

23. A dynamically stabilizable amplifier for driving an output current into a resistive, inductive, and capacitive (RLC) load, comprising:
   a driver stage that generates the output current on an output;
   a stabilizing resistor at the output of the driver stage; and
   a control circuit that:
      determines a level of the output current of the amplifier;
      compares the output current level with one or more thresholds; and
      selectively enables the stabilizing resistor based on the comparison so that the amplifier is stable across a range of the output current level;
   wherein an input current level received by the amplifier sets the output current level independent of the RLC load;
   wherein to determine the level of the output current of the amplifier, the control circuit:
      determines the input current level; and
   wherein to compare the output current level with one or more thresholds, the control circuit:
      compares the input current level with the one or more thresholds.

24. A method for dynamically stabilizing an amplifier driving an output current into a resistive, inductive, and capacitive (RLC) load, comprising:
   determining a level of the output current of the amplifier;
   comparing the output current level with one or more thresholds; and
   selectively enabling a stabilizing resistor at an output of the driver stage based on said comparing so that the amplifier is stable across a range of the output current level;
   receiving an input current level that sets the output current level independent of the RLC load;
   wherein said determining the level of the output current of the amplifier comprises:
      determining the input current level; and
   wherein said comparing the output current level with one or more thresholds comprises:
      comparing the input current level with the one or more thresholds.

* * * * *

UNITED STATES PATENT AND TRADEMARK OFFICE
CERTIFICATE OF CORRECTION

PATENT NO. : 11,277,104 B2
APPLICATION NO. : 16/786956
DATED : March 15, 2022
INVENTOR(S) : Parupalli et al.

It is certified that error appears in the above-identified patent and that said Letters Patent is hereby corrected as shown below:

In the Claims

Column 12, Line 24, Claim 3, delete "resistor that has" and insert -- resistor has --, therefor.

Column 13, Line 36, Claim 11, delete "resistor that has" and insert -- resistor has --, therefor.

Signed and Sealed this
Tenth Day of May, 2022

Katherine Kelly Vidal
*Director of the United States Patent and Trademark Office*